United States Patent
Fredriksson (10) Patent No.: US 11,979,166 B2
(45) Date of Patent: May 7, 2024

(54) DAC WEIGHT CALIBRATION

(71) Applicant: Telefonaktiebolaget LM Ericsson (publ), Stockholm (SE)

(72) Inventor: Henrik Fredriksson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 109 days.

(21) Appl. No.: 17/782,187

(22) PCT Filed: Dec. 5, 2019

(86) PCT No.: PCT/EP2019/083806
§ 371 (c)(1),
(2) Date: Jun. 3, 2022

(87) PCT Pub. No.: WO2021/110268
PCT Pub. Date: Jun. 10, 2021

(65) Prior Publication Data
US 2023/0030923 A1    Feb. 2, 2023

(51) Int. Cl.
*H03M 1/10* (2006.01)
*H03M 1/06* (2006.01)

(52) U.S. Cl.
CPC .................. *H03M 1/0658* (2013.01)

(58) Field of Classification Search
CPC ............... H03M 1/0658; H03M 1/10
(Continued)

(56) References Cited

U.S. PATENT DOCUMENTS

| 4,335,373 A | 6/1982 | Sloane |
| 5,305,004 A | 4/1994 | Fattaruso |

(Continued)

FOREIGN PATENT DOCUMENTS

EP    1622272 B1    10/2008

OTHER PUBLICATIONS

Andersson, K Ola, "Modeling and Implementation of Current-Steering Digital-to-Analog Converters", Linköping Studies in Science and Technology, Dissertation No. 944, Department of Electrical Engineering, Linköpings universitet, 2005, 1-194.
(Continued)

*Primary Examiner* — Peguy Jean Pierre
(74) *Attorney, Agent, or Firm* — Murphy, Bilak & Homiller, PLLC (57) ABSTRACT

A method of weight calibration in a DAC (25) is disclosed. The DAC (25) comprises an input port (100) for receiving a sequence of digital input words (x[n]), each representing a digital input sample, and a digital control circuit (110) configured to encode each digital input word (x[n]) into a control word (z[n]) representing the same digital input sample. Each bit ($Z_i$) in the control word (z[n]) has a corresponding bit weight ($w_i$) and is in the following considered to adopt values in $\{-1, 1\}$. Furthermore, the DAC (25) comprises a set (120) of analog weights, each associated with a unique one of the bits ($Z_i$) in the control word (z[n]), and summation circuitry (130) configured to generate an analog sample corresponding to the digital input sample by summing the bits in the control word ($Z_i$) weighted by the respective associated analog weights. The DAC (25) also has an output (140) for outputting the analog sample. The method comprises, during a measurement procedure, for a first set of at least one bit of the control word (z[n]), generating (300) the bits of the first set, such that a first sum of the bits in the first set weighted by their respective bit weights is, on average, above zero. Furthermore, the method comprises, during the measurement procedure, for a second set of at least one bit of the control word (z[n]), generating (310) the bits of the second set, such that a second sum of the bits in the second set weighted by their respective bit weights is, on average, below zero and such that the sum of the first sum and the second sum is, on average, equal to
(Continued)

zero. The method also comprises detecting (330) a DC level at the output of the DAC during the measurement procedure. The method further comprises adjusting (340) at least one analog weight in response to the detected DC level. A corresponding DAC, a corresponding electronic apparatus, and a corresponding integrated circuit are also disclosed.

21 Claims, 4 Drawing Sheets

(58) Field of Classification Search
USPC .......................................... 341/120, 118, 144
See application file for complete search history.

(56) References Cited

U.S. PATENT DOCUMENTS

| | | | |
|---|---|---|---|
| 9,337,860 B1* | 5/2016 | Li | H03M 1/0692 |
| 9,991,900 B1 | 6/2018 | Kabir et al. | |
| 11,146,282 B1* | 10/2021 | Lok | H03M 1/462 |
| 2002/0008651 A1 | 1/2002 | Bugeja et al. | |

OTHER PUBLICATIONS

Bengt, Jonsson B, "DAC Calibration IPR", Ericsson Internal Report, Jan. 12, 2018, 1-16.

* cited by examiner

DAC WEIGHT CALIBRATION

TECHNICAL FIELD

The present invention relates to weight calibration in a digital-to-analog converter.

BACKGROUND

Digital-to-analog converters (DACs) are interface circuits between the digital and the analog domain and are used whenever a conversion from a digital signal representation to an analog signal representation is needed. For instance, in radio transmitters, a lot of the signal processing is typically done in the digital domain. However, the signal to be fed into the antenna typically uses an analog representation. Hence, a DAC is used somewhere in the signal chain leading up to the antenna.

Some types of DAC utilize analog weights that are selectively summed in the analog domain under control of a digital control word derived from the digital input of the DAC in order to generate the analog output of the DAC. Mismatch between nominal and actual values of the analog weights give rise to unwanted nonlinear distortion in the analog output of the DAC. This can be counteracted to some extent using so called dynamic element matching (DEM). DEM utilizes a redundant configuration where multiple different digital control words can be used to represent a given digital input value and randomizes between those different digital control words in order to alter the characteristics of the errors resulting from the mismatch. DEM does not remove the mismatch errors, but rather spreads the energy of the errors over a wider frequency range (than if no DEM had been applied).

Other methods of mitigating the effect of weight mismatches include calibration. With this, distortion is not spread out but rater removed or subtracted from the output signal. Due to changes in physical properties (for example temperature changes, transistor aging, supply valuations etc.) calibration typically needs to be performed in regular intervals. The traditional way of making calibration is to disrupt normal data through the DAC and send some form of known test pattern through the DAC and detect specific mismatch imperfections based on measurements of the output of the DAC. Other calibration methods include swapping parts of the DAC out of normal operations (swapping in extra parts instead) and calibrate critical propertied of the swapped-out part. These calibration methods either require disruption of DAC functionality during calibration or extra hardware to calibrate individual parts of the DAC at the same time performing normal operation. Both are disadvantageous from a performance and complexity point of view due to extra hardware in critical signal paths.

SUMMARY

Embodiments of the present disclosure relates to detection of mismatch between analog weights in a DAC such that these mismatch errors can be reduced through calibration. Embodiments of the present disclosure are based on the inventor's insight that the mismatch between two analog weights, or two sets of analog weights, can be selectively detected as a DC offset at the output of the DAC provided that the generation of the digital control word follow certain criteria. Thereby, mismatch calibration of DACs is enabled without a need to interrupt normal operation or swapping parts of the DAC out of normal operation for offline calibration.

According to a first aspect, a method of weight calibration in a DAC is provided. The DAC comprises an input port for receiving a sequence of digital input words, each representing a digital input sample, and a digital control circuit configured to encode each digital input word into a control word representing the same digital input sample. Each bit in the control word has a corresponding bit weight and is in the following considered to adopt values in $\{-1, 1\}$. Furthermore, the DAC comprises a set of analog weights, each associated with a unique one of the bits in the control word, and summation circuitry configured to generate an analog sample corresponding to the digital input sample by summing the bits in the control word weighted by the respective associated analog weights. The DAC also has an output for outputting the analog sample. The method comprises, during a measurement procedure, for a first set of at least one bit of the control word, generating the bits of the first set, such that a first sum of the bits in the first set weighted by their respective bit weights is, on average, above zero. Furthermore, the method comprises, during the measurement procedure, for a second set of at least one bit of the control word, generating the bits of the second set, such that a second sum of the bits in the second set weighted by their respective bit weights is, on average, below zero and such that the sum of the first sum and the second sum is, on average, equal to zero. The method also comprises detecting a DC level at the output of the DAC during the measurement procedure. The method further comprises adjusting at least one analog weight in response to the detected DC level.

The method may comprise, for each of the bits of the control word not in the first set or the second set, generating the bit such that the bit is, on average, zero.

According to some embodiments, each of the first set and the second set consists of a single bit.

According to some embodiments, the first set and the second set consist of different numbers of bits.

According to some embodiments, each of the first set and the second set consists of multiple bits.

Said measurement procedure may be iterated with different bits in the first or second sets, thereby resulting in a plurality of detected DC levels.

The step of adjusting at least one analog weight may comprise adjusting, in each iteration of the measurement procedure, at least one analog weight associated with bits in the first set or the second set in that iteration of the measurement procedure in response to the detected DC level in that iteration of the measurement procedure.

The method may comprise computing weight adjustments in response to the plurality of detected DC levels after the iterations of the measurement procedure, and the step of adjusting at least one analog weight may comprise performing the computed adjustments.

According to a second aspect, there is provided a DAC. The DAC comprises an input port for receiving a sequence of digital input words, each representing a digital input sample, and a digital control circuit configured to encode each digital input word into a control word representing the same digital input sample. Each bit in the control word has a corresponding bit weight and is in the following considered to adopt values in $\{-1, 1\}$. Furthermore, the DAC comprises a set of analog weights, each associated with a unique one of the bits in the control word, and summation circuitry configured to generate an analog sample corresponding to the digital input sample by summing the bits in the control word weighted by the respective associated analog weights. The DAC also has an output for outputting the analog sample. In at least one weight-calibration mode, the digital control circuit is configured to, during a measurement procedure, for a first set of at least one bit of the control word, generate the bits of the first set such that a first sum of the bits in the first set weighted by their respective bit weights is, on average, above zero. Furthermore, in the at least one weight-calibration mode, the digital control circuit is configured to, during the measurement procedure, for a second set of at least one bit of the control word, generate the bits of the second set such that a second sum of the bits in the second set weighted by their respective bit weights is, on average, below zero and such that the sum of the first sum and the second sum is, on average, equal to zero. Furthermore, the DAC comprises a DC-detection circuit configured to detect a DC level at the output of the DAC during the measurement procedure. Moreover, the DAC comprises a calibration circuit configured to adjust at least one analog weight in response to the detected DC level.

The digital control circuit is configured to, in the at least one of the weight calibration modes, for each of the bits of the control word not in the first set or the second set, generate the bit such that the bit is, on average, zero.

In some embodiments, each of the first set and the second set consists of a single bit in at least one of the weight-calibration modes.

In some embodiments, the first set and the second set consist of different numbers of bits in at least one of the weight-calibration modes.

In some embodiments, each of the first set and the second set consists of multiple bits in at least one of the weight-calibration modes.

In some embodiments, the control circuit is configured to iterate said measurement procedure with different bits in the first or second sets, thereby resulting in a plurality of detected DC levels by the DC-detection circuit.

The calibration circuit may be configured to, in each iteration of the measurement procedure, adjust at least one analog weight associated with bits in the first set or the second set in that iteration of the calibration procedure in response to the detected DC level in that iteration of the calibration procedure.

The control circuit may be configured to compute weight adjustments in response to the plurality of detected DC levels after the iterations of the measurement procedure. The calibration circuit may be configured to perform the computed adjustments.

According to a third aspect, there is provided an electronic apparatus comprising the DAC according to the second aspect.

The electronic apparatus may, for instance, be a communication apparatus, such as a wireless communication device or a base station for a cellular communications system.

According to a fourth aspect, there is provided an integrated circuit comprising the DAC according to the second aspect.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
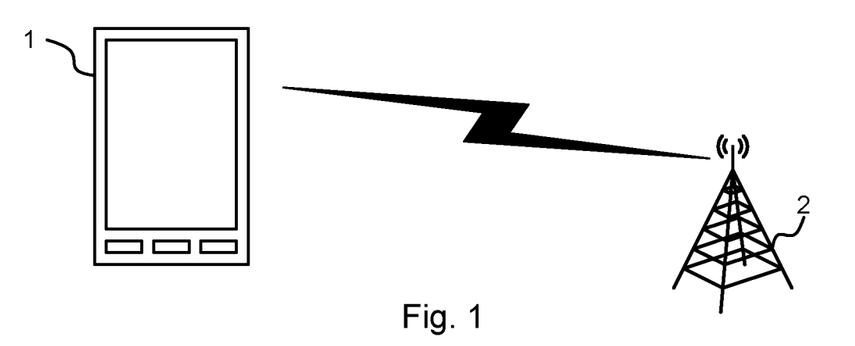
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
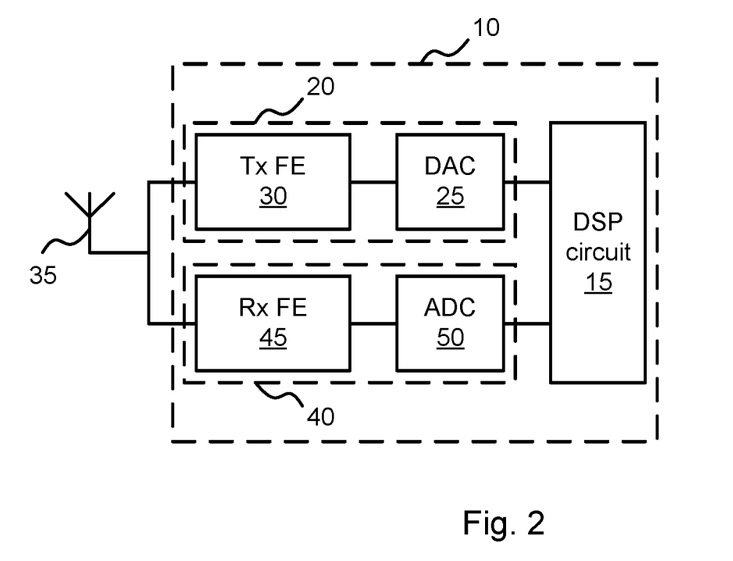
FIG. 2 illustrates a transceiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. In some embodiments, the DAC 25 is a baseband DAC configured to generate the output signal in a baseband frequency range. In other embodiments, the DAC 25 is a radio-frequency (RF) DAC configured to generate the output signal in an RF range. In yet other embodiments, the DAC 25 is an intermediate-frequency (IF) DAC configured to generate the output signal in an IF range. The DSP circuit 15 may e.g. include a digital mixer or digital up conversion in the transmit path, such that the input signal to the DAC is an RF or an IF signal, whichever the case may be. In any case, the input signal to the DAC 25 can be generated such that the intended output signal from the DAC 25 has zero signal content at DC, or 0 Hz. The transmitter circuit 20 also comprises a transmitter (Tx) frontend (FE) circuit 30 connected between the DAC 25 and an antenna 35. The Tx FE circuit 30 is configured to transform the output signal from the DAC 25 to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. The ADC 50 is connected between the Rx FE circuit 45 and the DSP circuit 15. The Rx FE circuit 45 is configured to transform a signal received via the antenna 35 to a format suitable to be input to the ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The ADC 50 is configured to receive its (analog) input signal from the Rx FE circuit, and convert it to a digital representation to generate the digital output signal of the ADC 50. This digital output signal of the ADC 50 is input to the DSP circuit 15 for further digital signal processing.

Before going into more details of embodiments of the present disclosure, terminology used in the disclosure is first established. A digital signal is a sequence of samples, where the samples are numbers. These numbers can be represented in a variety of different number formats within a digital circuit. A word is used to represent a number in a given number format. The word consists of a number of bits. Each bit can adopt a low value and a high value. In this disclosure, the low value is considered to be −1, and the high value is considered to be +1 (or simply 1). It should be noted that this is merely an abstract convention that is used to provide a relatively simple mathematical description of the functionality of the embodiments disclosed herein, for instance in that the average of the low and the high value is 0. In a physical circuit, the high and low values are typically represented with different voltage levels. The same physical circuit could be described using another convention, for instance considering the low value to be 0 and the high value to be 1. This would slightly alter the mathematical description of the circuit, but would not alter the physical circuit or its functionality.

Reference is made below to the time average of different sequences. This should be interpreted as the arithmetic average. That is, the time average of a given sequence during a time interval is the sum of the sample values of the given sequence in that time interval divided by the number of samples of the given sequence in that time interval.

Each bit has an associated bit weight given by the number format used. The number represented by the word is the sum, taken over all bits in the word, of the bit value multiplied with the bit weight. That is, if the number is denoted Z, the word is denoted z, the bits are denoted $z_i$, i=1, 2, ..., M, and the bit weights are denoted $w_i$, the number Z is given by $$Z = \sum_{i=1}^{M} z_i w_i \qquad (1)$$

Note that, with the convention that the bits adopt values of either −1 or 1, the difference between two neighboring numbers is 2, provided that the bit weights are integer. The DAC circuits considered in this disclosure are of the type that comprises a number of analog weights and selectively sums these analog weights together under control of a digital control word to form an analog output value. The number of weights is equal to the number of bits in the control word. Assume that the word z described above is used as the control word. Further, let the analog weights be denoted $a_i$ and the analog output value be denoted Y. Below, the notation Y(t) is used in some places to indicate that the output value Y varies as a function of time t as a sequence of control words z[n] is applied. The analog output value Y is given by $$Y = \sum_{i=1}^{M} z_i a_i \qquad (2)$$

Ideally, each analog weight $a_i$ is proportional to the corresponding (digital) bit weight $w_i$, i.e. $a_i = Cw_i$, where C is a constant. In that case, the analog output value Y is also proportional to the number Z, i.e. Y=C·Z, which is the desired function of the DAC. However, due to factors such as manufacturing inaccuracies and temperature variations, there will be a mismatch between analog weights, which results in nonlinear distortion in the output of the DAC. Some embodiments of the present disclosure seek to detect such mismatch between analog weights. Furthermore, some embodiments of the present disclosure seek to adjust the analog weights to counteract the detected mismatch.

Figure 3:
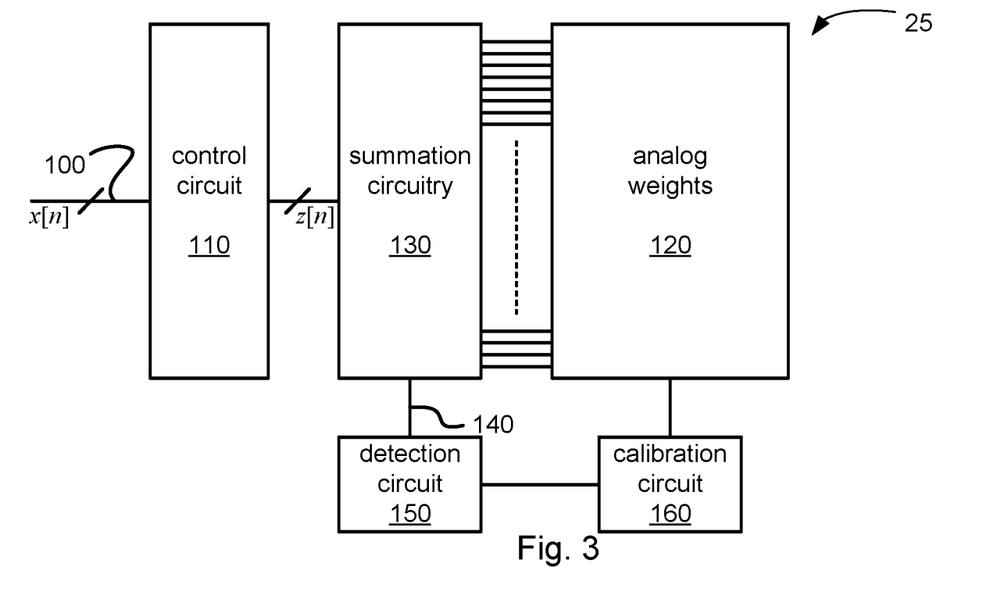
FIG. 3 is a diagram of a DAC according to some embodiments.

FIG. 3 is a block diagram of the DAC 25 according to some embodiments. It comprises an input port 100 for receiving a sequence of digital input words x[n], each representing a digital input sample. The integer n is a sequence index indicating a given sample in the sequence. Furthermore, the DAC comprises a digital control circuit (110) configured to encode each digital input word x[n] into a control word z[n] representing the same digital input sample. Each bit $z_i$ in the control word z[n] has a corresponding bit weight $w_i$, and is in the following considered to adopt values in {−1, 1}, as mentioned above. Moreover, the DAC 25 comprises a set 120 of analog weights, each associated with a unique one of the bits $z_i$ in the control word z[n]. The DAC 25 further comprises summation circuitry 130 configured to generate an analog sample corresponding to the digital input sample by summing the bits in the control word $z_i$ weighted by the respective associated analog weights, as mentioned above with reference to Eq. (2). The DAC 25 also has an output 140 for outputting the analog sample.

In some embodiments, there are multiple bits in the control word z[n] with the same bit weight. The analog weights associated with bits in the control word z[n] having the same bit weight are sometimes referred to below as analog weights with the same nominal weight. Conversely, analog weights associated with bits in the control word z[n] having different bit weight are sometimes referred to below as analog weights different nominal weights.

In embodiments of the present disclosure (further described in more detail below), the digital control circuit 110 generates the bits $z_i$ in such a way that the mismatch between analog weights can be detected as a DC level at the output 140 of the DAC 25. To perform this detection, the DAC 25 comprises a DC-detection circuit 150 configured to detect a DC level at the output 140 of the DAC 25. Furthermore, according to some embodiments, the DAC 25 comprises a calibration circuit 160 configured to adjust analog weights in response to the detected DC level, or a plurality of such detected DC levels. Thereby, mismatch errors can be reduced.

The DC level (or time average) of the sequence of numbers Z[n] represented by the sequence of control word z[n] is denoted $\bar{Z}$. Furthermore, the DC level (or time average) of each bit $z_i[n]$ in the sequence of control words z[n] is denoted $\bar{z}_i$. It is readily realized that $$\bar{Z} = \sum_{i=1}^{M} \bar{z}_i w_i \tag{3}$$

Furthermore, the DC level (or average) of the analog output Y(t), which is denoted $\bar{Y}$, is given by $$\bar{Y} = \sum_{i=1}^{M} \bar{z}_i a_i \tag{4}$$

In implementations, the analog output Y(t) is represented with a physical quantity, such as an electrical voltage or an electrical current. It should be noted that the zero-level of the analog output Y(t) does not necessarily correspond to a zero value of the physical quantity, it could be some other fixed level. Therefore, statements in this disclosure saying that the DC level $\bar{Y}$ of Y(t) is either above or below zero should be interpreted as that the DC level of the physical quantity representing Y(t) is either above or below that fixed level (which, again, is not necessarily zero V, or zero A, or whatever the unit for the physical quantity may be).

In some embodiments, the bits $z_i[n]$ in the control word z[n] are divided into three sets. For a first set of at least one bit of the control word z[n], the bits in the first set are generated such that the sum of the bits in the first set weighted by their respective bit weights is, on average, above zero. This sum is below referred to as "the first sum" and denoted $a_1$. Expressed with mathematical notation $$0 < \sigma_1 = \sum_{i \in G_1} \bar{z}_i w_i \tag{5}$$

where $G_1$ is the set of indices i for which the bits $z_i$ are in said first set of bits.

For a second set of at least one bit of the control word z[n], the bits in the second set are generated such that the sum of the bits in the second set weighted by their respective bit weights is, on average, below zero. This sum is below referred to as "the second sum" and denoted $\sigma_2$. Expressed with mathematical notation $$0 > \sigma_2 = \sum_{i \in G_2} \bar{z}_i w_i \tag{6}$$

where $G_2$ is the set of indices i for which the bits $z_i$ are in said second set of bits. Furthermore, the bits in the first and the second set are generated such that $$\sigma_1 + \sigma_2 = 0 \tag{7}$$

In some embodiments, the bits that are neither in the first set nor in the second set form a third set. In some embodiments, the third set is empty. In some embodiments, the bits in the third set provides a zero, or at least a negligible, contribution to the DC level at the output due to that the associated analog weights have been mutually matched, e.g. using calibration procedures described herein. In some embodiments, each of the bits in the third set is generated such that the bit is, on average, 0. That is, each bit in the third set adopts the value −1 on average as often as the value +1, whereby they each provide a zero contribution to the DC level at the output. Some means to achieve this are given in the context of specific embodiments further down in this detailed description.

Under these conditions, the DC level at the output is given by $$\bar{Y} = \sum_{i \in G_1} \bar{z}_i a_i + \sum_{i \in G_2} \bar{z}_i a_i \tag{8}$$

Only the bits in the first set and the second set provide nonzero contributions to the DC level at the output. Ideally, $a_i = Cw_i$, so ideally $$\bar{Y} = C(\sigma_1 + \sigma_2) = 0 \tag{9}$$

However, as discussed above, there will in reality be a mismatch between the analog weights such that $$\begin{aligned} \bar{Y} &= z_A \sum_{i \in G_1} a_i + z_B \sum_{i \in G_2} a_i \\ &= C_1 \sum_{i \in G_1} \bar{z}_i w_i + C_2 \sum_{i \in G_2} \bar{z}_i w_i \\ &= C_1 \sigma_1 + C_2 \sigma_2 \end{aligned} \tag{10}$$

where $C_1 \neq C_2$. It would be desired to have $C_1$ and $C_2$ as closely matched as possible, to be as close as possible to the ideal operation where $C_1 = C_2 = C$. From Eq. (7), we have that $\sigma_2 = -\sigma_1$, so $$\bar{Y} = (C_1 - C_2)\sigma_1 \tag{11}$$

Since $\sigma_1 > 0$, it can be concluded that if $\bar{Y} > 0$, then $C_1 > C_2$, and if $\bar{Y} < 0$, then $C_2 > C_1$. Hence, in order to reduce the absolute difference between $C_1$ and $C_2$, the analog weights can be adjusted by increasing the analog weights associated with the bits in the second set or decreasing the analog weights associated with the bits in the in the first set, or both, if $\bar{Y} > 0$; or increasing the analog weights associated with the bits in the in the first set or decreasing the analog weights associated with the bits in the in the second set, or both, if $\bar{Y} < 0$.

In some embodiments, in line with the discussion above, the digital control circuit 110 is, in at least one weight-calibration mode, configured to:

for a first set of at least one bit of the control word z[n]: generate the bits of the first set such that a first sum of the bits in the first set weighted by their respective bit weights is, on average, above zero; and for a second set of at least one bit of the control word z[n]: generate the bits of the second set such that a second sum of the bits in the second set weighted by their respective bit weights is, on average, below zero and such that the sum of the first sum and the second sum is, on average, equal to zero.

Furthermore, in some embodiments, the digital control circuit 110 is configured to, in at least one of the weight calibration modes, generate each of the bits not in the first set or the second set such that the bit is, on average, zero.

Furthermore, in some embodiments, the calibration circuit 160 is configured to adjust analog weights associated with the bits in the first set or the second set in response to the detected DC level. The word "or" in the preceding sentence should be interpreted as a normal logical "or" (i.e. "and/or", not as an "exclusive or").

The above described measurements and adjustments of the analog bit weights can be iterated with different sets of bits in order to successively calibrate the analog bit weights to within a desired tolerance. Alternatively, as is further described below, multiple measurements can be made using different bits in the first or second set without making any adjustment, resulting in a plurality of detected DC levels. The word "or" in the preceding sentence should be interpreted as a normal logical "or" (i.e. "and/or", not as an "exclusive or"). That is, either the first set or the second set, or both, may be changed between iterations. From these detected DC levels, weight adjustments can be computed for multiple analog weights, and then performed by the calibration circuit 160. Either way, the calibration can be done "online", i.e. during normal use of the DAC 25. No specific training signal is needed. Furthermore, it is not necessary to swap parts of the DAC out of normal operation (swapping in extra parts instead) and calibrate the swapped-out parts "offline". Hence, such extra parts are not needed.

There are numerous different architectures that can be used to implement the DAC 25 for which the mismatch detection and calibration described herein can be applied. Some examples presented below are the thermometer-coded DAC architecture, the segmented DAC architecture, and the decomposed DAC architecture.

Thermometer-coded DAC

In a traditional thermometer-coded DAC, an N-bit binary-weighted input word is encoded into an $M=(2^N-1)$-bit thermometer-coded control word, in which each bit has (the same) bit weight 1. To distinguish these control bits of the traditional thermometer-coded DAC from the control bits $z_i$ used in embodiments of the present disclosure, we denote them $q_i$. Below is a table (Table 1) illustrating the mapping from the input bits xi to the control bits $q_i$ for N=3.

Table 1

TABLE 1

| | | bit | | | | | | | | |
|---|---|---|---|---|---|---|---|---|---|---|
| | $x_3$ | $x_2$ | $x_1$ | $q_7$ | $q_6$ | $q_5$ | $q_4$ | $q_3$ | $q_2$ | $q_1$ |
| | | | | | weight | | | | | |
| decimal | 4 | 2 | 1 | 1 | 1 | 1 | 1 | 1 | 1 | 1 |
| −7 | −1 | −1 | −1 | −1 | −1 | −1 | −1 | −1 | −1 | −1 |
| −5 | −1 | −1 | 1 | −1 | −1 | −1 | −1 | −1 | −1 | 1 |
| −3 | −1 | 1 | −1 | −1 | −1 | −1 | −1 | −1 | 1 | 1 |
| −1 | −1 | 1 | 1 | −1 | −1 | −1 | −1 | 1 | 1 | 1 |
| 1 | 1 | −1 | −1 | −1 | −1 | −1 | 1 | 1 | 1 | 1 |
| 3 | 1 | −1 | 1 | −1 | −1 | 1 | 1 | 1 | 1 | 1 |
| 5 | 1 | 1 | −1 | −1 | 1 | 1 | 1 | 1 | 1 | 1 |
| 7 | 1 | 1 | 1 | 1 | 1 | 1 | 1 | 1 | 1 | 1 |

In some embodiments, a modified thermometer-coded DAC is used. In some of these embodiments, each of the first set and the second set contains a single bit. For such an embodiment, the bit in the first set is below denoted $z_A$, and the bit in the second set is below denoted $z_B$. It can be noted from the table above that the bit $q_3$ is on average above zero and the bit $q_5$ is on average below zero, assuming that the samples of the input sequence are symmetrically distributed around zero. This is true for many types of signals, for instance for digitally upconverted communication signals (e.g. digitally upconverted OFDM (Orthogonal Frequency Division Multiplexing) or spread-spectrum signals) that are close to the Shannon bound and therefore have a noise-like appearance. This assumption is used also in the other embodiments and examples below. Furthermore, $q_3+q_5=0$. Hence, the bit $z_A$ in the first set can be generated as the bit $q_3$ and the bit $z_B$ in the second set can be generated as the bit $q_5$. The bits in $z_i$ in the third set should be generated with a zero average. Notably, bit $q_4$ in the table above has a zero average, so one of the bits $z_i$ in the third set can be generated as the bit $q_4$. The remaining bits $z_i$ in the third set can be generated by applying dynamic element matching to the bits $q_1$, $q_2$, $q_6$, and $q_7$.

Alternatively, since bit $q_2$ is on average above zero and the bit $q_6$ is on average below zero, and $\bar{q}_2+\bar{q}_6=0$, the bit $z_A$ in the first set can be generated as the bit $q_2$ and the bit $z_B$ in the second set can be generated as the bit $q_6$. In that case, one of the bits $z_i$ in the third set can again be generated as the bit $q_4$, and the remaining bits $z_i$ in the third set can be generated by applying dynamic element matching to the bits $q_1$, $q_3$, $q_5$, and $q_7$.

Further alternatively, since bit $q_1$ is on average above zero and the bit $q_7$ is on average below zero, and $\bar{q}_1+\bar{q}_7=0$, the bit $z_A$ in the first set can be generated as the bit $q_1$ and the bit $z_B$ in the second set can be generated as the bit $q_7$. In that case, one of the bits $z_i$ in the third set can again be generated as the bit $q_4$, and the remaining bits $z_i$ in the third set can be generated by applying dynamic element matching to the bits $q_2$, $q_3$, $q_5$, and $q_6$.

The control circuit 110 for the modified thermometer-coded embodiments described above can, for instance, comprise a binary-to-thermometer encoder configured to generate the bits $q_i$, followed by a switching network configured to map the bits $q_i$ onto the bits $z_i$ in the control word.

The dynamic element matching discussed above can, for example, be implemented in a fairly simple way by grouping bits $q_i$ in pairs for which the average of the sum of the bits in each pair is zero. Such pairs are $q_1$ and $q_7$, $q_2$ and $q_6$, and $q_3$ and $q_5$. One of these pairs will be mapped onto the bit $z_A$ in the first set and the bit $z_B$ in the second set according to the discussion above, and will not be subject to dynamic element matching. For the sake of illustration, say that this is the pair $q_3$ and $q_5$. Each of the other pairs can then be mapped onto a corresponding pair of bits in said third set. For instance, the pair of bits $q_1$ and $q_7$ can be mapped onto the pair of bits $z_j$ and $z_k$. By randomly or pseudo randomly selecting, for each sample instant n, which of $q_1$ and $q_7$ is mapped onto which of $z_j$ and $z_k$, $z_j$ and $z_k$ will each get an average value of zero over time. Similarly, the pair of bits $q_2$ and $q_6$ can be mapped onto the pair of bits $z_l$ and $z_m$. By randomly or pseudo randomly selecting, for each sample instant n, which of $q_2$ and $q_6$ is mapped onto which of $z_l$ and $z_m$, $z_l$ and $z_m$ will each get an average value of zero over time. Below, this dynamic element matching technique is referred to as pairwise swapping.

By going through a number of iterations and varying which of the bits $z_1$-$z_7$ are selected as the bits $z_A$ in the first set and $z_B$ in the second set, it is possible to match all of the analog weights $a_1$-$a_7$ with each other. For instance, one of the analog weights, say $a_1$, may be used as a reference. The corresponding bit $z_1$ may be used as $z_A$ in all iterations, whereas each of the other bits $z_2$-$z_7$ can be used as the bit $z_B$ in different iterations. Thereby, the analog weights $a_2$-$a_7$ can each be matched with the reference analog weight $a_1$, and thereby also with each other.

The example above with N=3 can be extended to other values of N in a straightforward manner by a person skilled in the art of digital-to-analog conversion.

Segmented DAC

In a segmented DAC, a number K<N of the most significant bits (MSBs) are converted into a thermometer code, whereas the remaining N−K least significant bits (LSBs) remain binary weighted. For a segmented DAC, the procedure described above can be applied to the thermometer-coded part. Each of the binary-weighted LSBs have an average value of zero, and does therefore not influence the calibration of the thermometer-coded part.

Decomposed DAC

The decomposed DAC architecture is e.g. described in K. O. Andersson, "Modeling and Implementation of Current-Steering Digital-to-Analog Converters", PhD dissertation, Linköpings universitet, 2005, ISBN 91-8529-796-8 (below referred to as [Andersson, 2005]). In its simplest form (1-layer decomposition), an N-bit binary-weighted input word is decomposed into two (N−1)-bit part and an additional 1-bit part, as illustrated in Table 2 below for a N=4.

TABLE 2

| | bit | | | | | | | | | | |
|---|---|---|---|---|---|---|---|---|---|---|---|
| | $x_4$ | $x_3$ | $x_2$ | $x_1$ | $q_7$ | $q_6$ | $q_5$ | $q_4$ | $q_3$ | $q_2$ | $q_1$ |
| | | | | | | weight | | | | | |
| decimal | 8 | 4 | 2 | 1 | 4 | 2 | 1 | 1 | 4 | 2 | 1 |
| −15 | −1 | −1 | −1 | −1 | −1 | −1 | −1 | −1 | −1 | −1 | −1 |
| −13 | −1 | −1 | −1 | 1 | −1 | −1 | −1 | −1 | −1 | −1 | 1 |
| −11 | −1 | −1 | 1 | −1 | −1 | −1 | −1 | −1 | −1 | 1 | −1 |
| −9 | −1 | −1 | 1 | 1 | −1 | −1 | −1 | −1 | −1 | 1 | 1 |
| −7 | −1 | 1 | −1 | −1 | −1 | −1 | −1 | −1 | 1 | −1 | −1 |
| −5 | −1 | 1 | −1 | 1 | −1 | −1 | −1 | −1 | 1 | −1 | 1 |
| −3 | −1 | 1 | 1 | −1 | −1 | −1 | −1 | −1 | 1 | 1 | −1 |
| −1 | −1 | 1 | 1 | 1 | −1 | −1 | −1 | −1 | 1 | 1 | 1 |
| 1 | 1 | −1 | −1 | −1 | −1 | −1 | −1 | 1 | 1 | 1 | 1 |
| 3 | 1 | −1 | −1 | 1 | −1 | −1 | 1 | 1 | 1 | 1 | 1 |
| 5 | 1 | −1 | 1 | −1 | −1 | 1 | −1 | 1 | 1 | 1 | 1 |
| 7 | 1 | −1 | 1 | 1 | −1 | 1 | 1 | 1 | 1 | 1 | 1 |
| 9 | 1 | 1 | −1 | −1 | 1 | −1 | −1 | 1 | 1 | 1 | 1 |
| 11 | 1 | 1 | −1 | 1 | 1 | −1 | 1 | 1 | 1 | 1 | 1 |
| 13 | 1 | 1 | 1 | −1 | 1 | 1 | −1 | 1 | 1 | 1 | 1 |
| 15 | 1 | 1 | 1 | 1 | 1 | 1 | 1 | 1 | 1 | 1 | 1 |

In the discussion below, each bit $z_i$ of the control word has the same weight as the corresponding bits $q_i$, i.e. $z_1$ has the same weight as $q_1$, $z_2$ has the same weight as $q_2$, etc. For matching the analog weights with the same nominal weight, a similar procedure as for the thermometer-coded DAC can be used. For instance, in a first calibration round, $q_3$, which is on average above zero, can be mapped onto $z_3$, and $q_7$, which is on average below zero, can be mapped onto $z_7$. The first set thus consists of the single bit $z_3$, the second set thus consists of the single bit $z_7$, and the remaining bits are comprised in the third set. The bit $q_4$ is on average equal to zero, and can e.g. be mapped onto $z_4$. The bits $z_1$ and $z_5$ can be generated by applying pairwise swapping to the bits $q_1$ and $q_5$. The bits $z_2$ and $z_6$ can be generated by applying pairwise swapping to the bits $q_2$ and $q_6$. The first calibration round can be iterated until the analog weights $a_3$ and $a_7$ have been matched within tolerable tolerances for a given specification.

Furthermore, in a second calibration round, $q_2$, which is on average above zero, can be mapped onto $z_2$, and $q_6$, which is on average below zero, can be mapped onto $z_6$. The first set thus consists of the single bit $z_2$, the second set thus consists of the single bit $z_6$, and the remaining bits are comprised in the third set. Again, the bit $q_4$ is on average equal to zero, and can e.g. be mapped onto $z_4$. As above, the bits $z_1$ and $z_5$ can be generated by applying pairwise swapping to the bits $q_1$ and $q_5$. The bits $z_3$ and $z_7$ can be generated by applying pairwise swapping to the bits $q_3$ and $q_7$. The second calibration round can be iterated until the analog weights $a_2$ and $a_6$ have been matched within tolerable tolerances for a given specification.

Since there are three bits with weight 1 ($z_1$, $z_4$, and $z_5$), the matching of the corresponding analog weights $a_1$, $a_4$, and as, may require some more iterations. For instance, one of them can be used as a reference to match the other two against. Say, for instance, that $a_1$ is used as a reference. Then, in a third calibration round, $a_5$ can be matched with $a_1$. In the third calibration round, $q_1$, which is on average above zero, can be mapped onto $z_1$, and $q_5$, which is on average below zero, can be mapped onto $z_5$. The first set thus consists of the single bit $z_1$, the second set thus consists of the single bit $z_5$, and the remaining bits are comprised in the third set. Again, the bit $q_4$ is on average equal to zero, and can be mapped onto $z_4$. The bits $z_2$ and $z_6$ can be generated by applying pairwise swapping to the bits $q_2$ and $q_6$. The bits $z_3$ and $z_7$ can be generated by applying pairwise swapping to the bits $q_3$ and $q_7$. The second calibration round can be iterated until the analog weights $a_1$ and $a_5$ have been matched within tolerable tolerances for a given specification. In some embodiments, this is done by only adjusting $a_5$ and leaving $a_1$ as is. Thereby, by matching $a_4$ to $a_1$ in a similar way in a fourth calibration round by only adjusting $a_4$ and leaving $a_1$ as is, $a_5$ is also matched to $a_4$. The fourth calibration round may be carried out in the same way as the third calibration round, with the modifications that $q_5$ is instead mapped onto $z_4$ and that $q_4$ is instead mapped onto $z_5$.

The decomposed architecture allows matching of analog weights with different nominal weights, as illustrated by examples below.

In the examples below, modifications of the mapping shown in Table 2 are applied. It can be observed in Table 2 that the sum of the bits $q_i$ with the same bit weight is, on average, equal to zero. That is, $q_1+q_4+q_5$ (and consequently $q_1w_1+q_4w_4+q_5w_5$) is on average equal to zero, $q_2+q_6$ (and consequently $q_2w_2+q_6w_6$) is on average equal to zero, and $q_3+q_7$ (and consequently $q_3w_3+q_7w_7$) is on average equal to zero. The modifications made in Tables 3 and 4 are made to change that in order for mismatch between analog weights with different nominal weights to show up as a DC offset at the output 140.

A first example, where analog weights $a_2$ and $a_6$ (associated with the bits $q_2$ and $q_6$, both with the bit weight 2) are matched with the analog weights $a_1$, $a_4$, and $a_5$ (associated with the bits $q_1$, $q_4$, and $q_5$, all with the bit weight 1) is illustrated with Table 3 below, which is a modification of Table 2 above. The modified parts are the entries for each of the bits q5, q4, and q2, for each of the input −11, −9, −3, and −1, and are based on the observation that, in Table 2, for inputs −1, −3, −9, and −11, bit $q_2$ with bit weight 2 is 1, and the two bits $q_5$ and $q_4$ with bit weight 1 are −1. By inverting these bits, the averages of $q_1+q_4+q_5$ and $q_2+q_6$ are changed without changing the represented number. Furthermore, it can be noted that the modifications do not alter the value of the sum $(q_1w_1+q_4w_4+q_5w_5)+(q_2w_2+q_6w_6)$. Since both the first and the second parenthesis are zero on average (for the values in Table 2), the whole expression is zero on average (both for the values in Table 2 and for the values in Table 3).

TABLE 3

| | | | | | | bit | | | | | |
|---|---|---|---|---|---|---|---|---|---|---|---|
| | $x_4$ | $x_3$ | $x_2$ | $x_1$ | $q_7$ | $q_6$ | $q_5$ | $q_4$ | $q_3$ | $q_2$ | $q_1$ |
| | | | | | | weight | | | | | |
| decimal | 8 | 4 | 2 | 1 | 4 | 2 | 1 | 1 | 4 | 2 | 1 |
| −15 | −1 | −1 | −1 | −1 | −1 | −1 | −1 | −1 | −1 | −1 | −1 |
| −13 | −1 | −1 | −1 | 1 | −1 | −1 | −1 | −1 | −1 | −1 | 1 |
| −11 | −1 | −1 | 1 | −1 | −1 | −1 | 1 | 1 | −1 | −1 | −1 |
| −9 | −1 | −1 | 1 | 1 | −1 | −1 | 1 | 1 | −1 | −1 | 1 |
| −7 | −1 | 1 | −1 | −1 | −1 | −1 | −1 | −1 | 1 | −1 | −1 |
| −5 | −1 | 1 | −1 | 1 | −1 | −1 | −1 | −1 | 1 | −1 | 1 |
| −3 | −1 | 1 | 1 | −1 | −1 | −1 | 1 | 1 | 1 | −1 | −1 |
| −1 | −1 | 1 | 1 | 1 | −1 | −1 | 1 | 1 | 1 | −1 | 1 |
| 1 | 1 | −1 | −1 | −1 | −1 | −1 | −1 | 1 | 1 | 1 | 1 |
| 3 | 1 | −1 | −1 | 1 | −1 | −1 | 1 | 1 | 1 | 1 | 1 |
| 5 | 1 | −1 | 1 | −1 | −1 | 1 | −1 | 1 | 1 | 1 | 1 |
| 7 | 1 | −1 | 1 | 1 | −1 | 1 | 1 | 1 | 1 | 1 | 1 |
| 9 | 1 | 1 | −1 | −1 | 1 | −1 | −1 | 1 | 1 | 1 | 1 |
| 11 | 1 | 1 | −1 | 1 | 1 | −1 | 1 | 1 | 1 | 1 | 1 |
| 13 | 1 | 1 | 1 | −1 | 1 | 1 | −1 | 1 | 1 | 1 | 1 |
| 15 | 1 | 1 | 1 | 1 | 1 | 1 | 1 | 1 | 1 | 1 | 1 |

In the first example, $q_1$ is mapped onto $z_1$, $q_4$ is mapped onto $z_4$, and $q_5$ is mapped onto $z_5$. The bits $z_1$, $z_4$, and $z_5$ form the first set. It is readily verified that the modification in Table 3 provides that $a_1$ $z_1w_1+z_4w_4+z_5w_5$ is on average above zero. Furthermore, in the first example, $q_2$ is mapped onto $z_2$ and $q_6$ is mapped onto $z_6$. The bits $z_2$ and $z_6$ form the second set. It is readily verified that the modification in Table 3 provides that $\sigma_2=z_2$ $w_2+z_6w_6$ is on average below zero. Furthermore, $\sigma_1+\sigma_2=(q_1w_1+q_4w_4+q_5w_5)+(q_2w_2+q_6w_6)$, which was observed above to be zero on average.

It is also possible to use slightly modified versions of the implementation above. For instance, the bits $z_1$ and $z_5$ may instead be generated by pairwise swapping of the bits $q_1$ and $q_5$. Alternatively or additionally, the bits $z_2$ and $z_6$ may instead be generated by pairwise swapping of the bits $q_2$ and $q_6$. None of these modifications alters the value of $\sigma_1$ or $\sigma_2$, so it still holds that $\sigma_1=z_1w_1+z_4w_4+z_5w_5$ is on average above zero, that $a_2=z_2w_2+z_6w_6$ is on average below zero, and that $\sigma_1+\sigma_2$ is zero on average.

The bits $z_3$ and $z_7$ form the third set. As noted above, $q_3+q_7$ is on average zero. If the analog weights $a_3$ and $a_5$ have been mutually well matched, e.g. in the above-mentioned first calibration round, then $q_3$ can be mapped onto $z_3$ and $q_7$ can be mapped onto $z_7$, and the bits $z_3$ and $z_7$ in the third set will provide a negligible contribution to the DC level $\overline{Y}$ at the output 140. Alternatively, $z_3$ and $z_7$ can be generated by applying pairwise swapping to the bits $q_3$ and $q_7$, whereby each of $z_3$ and $z_7$ is, on average, zero.

If the detected DC level at the output 140 is above zero, then the analog weights can be adjusted by either increasing the analog weights $a_2$ and $a_6$, or by decreasing the analog weights $a_1$, $a_4$, and a5. Conversely, if the detected DC level at the output 140 is below zero, then the analog weights can be adjusted by either decreasing the analog weights $a_2$ and $a_6$, or by increasing the analog weights $a_1$, $a_4$, and a5. This procedure can be iterated until the analog weights $a_2$ and $a_6$ have been matched with the analog weights $a_1$, $a_4$, and $a_5$ to within tolerable tolerances for a given specification.

A second example, where analog weights $a_3$ and $a_7$ (associated with the bits $q_3$ and $q_7$, both with the bit weight 4) are matched with the other analog weights $a_1$, $a_2$, $a_4$, $a_5$, and $a_6$ (associated with the bits $q_1$, $q_2$, $q_4$, $q_5$, and $q_6$, all with bit weights less than 4) is illustrated with Table 4 below, which is a modification of Table 2 above—see the table entries for bits q6, q5, q4, and q3, for each of the inputs −7, −5, −3, and −1. As for Table 3, the modified parts are the entries for each of the bits q5, q4, and q2, for each of the inputs −11, −9, −3, and −1. The modification is based on the observation that, in Table 2, for inputs −1, −3, −5, and −7, bit $q_3$ with bit weight 4 is 1, and the bit $q_6$ with bit weight 2 and the two bits $q_5$ and $q_4$ with bit weight 1 are −1. By inverting these bits, the averages of $(q_1+q_4+q_5)+(q_2+q_6)$ and $q_3+q_7$ are changed without changing the represented number. Furthermore, it can be noted that the modifications do not alter the value of the sum $(q_1w_1+q_4w_4+q_5w_5)+(q_2w_2+q_6w_6)+(q_3w_3+q_7w_7)$. Since all three parentheses individually are zero on average (for the values in Table 2), the whole expression is zero on average (both for the values in Table 2 and for the values in Table 4).

TABLE 4

| | bit | | | | | | | | | |
|---|---|---|---|---|---|---|---|---|---|---|
| $x_4$ | $x_3$ | $x_2$ | $x_1$ | $q_7$ | $q_6$ | $q_5$ | $q_4$ | $q_3$ | $q_2$ | $q_1$ |
| | | | | | weight | | | | | |
| decimal 8 | 4 | 2 | 1 | 4 | 2 | 1 | 1 | 4 | 2 | 1 |
| −15 −1 | −1 | −1 | −1 | −1 | −1 | −1 | −1 | −1 | −1 | −1 |
| −13 −1 | −1 | −1 | 1 | −1 | −1 | −1 | −1 | −1 | −1 | 1 |
| −11 −1 | −1 | 1 | −1 | −1 | −1 | −1 | −1 | −1 | 1 | −1 |
| −9 −1 | −1 | 1 | 1 | −1 | −1 | −1 | −1 | −1 | 1 | 1 |
| −7 −1 | 1 | −1 | −1 | −1 | 1 | 1 | 1 | −1 | −1 | −1 |
| −5 −1 | 1 | −1 | 1 | −1 | 1 | 1 | 1 | −1 | −1 | 1 |
| −3 −1 | 1 | 1 | −1 | −1 | 1 | 1 | 1 | −1 | 1 | −1 |
| −1 −1 | 1 | 1 | 1 | −1 | 1 | 1 | 1 | −1 | 1 | 1 |
| 1 1 | −1 | −1 | −1 | −1 | −1 | −1 | 1 | 1 | 1 | 1 |
| 3 1 | −1 | −1 | 1 | −1 | −1 | −1 | 1 | 1 | 1 | 1 |
| 5 1 | −1 | 1 | −1 | −1 | 1 | −1 | 1 | 1 | 1 | 1 |
| 7 1 | −1 | 1 | 1 | −1 | 1 | 1 | 1 | 1 | 1 | 1 |
| 9 1 | 1 | −1 | −1 | 1 | −1 | −1 | 1 | 1 | 1 | 1 |
| 11 1 | 1 | −1 | 1 | 1 | −1 | 1 | 1 | 1 | 1 | 1 |
| 13 1 | 1 | 1 | −1 | 1 | 1 | −1 | 1 | 1 | 1 | 1 |
| 15 1 | 1 | 1 | 1 | 1 | 1 | 1 | 1 | 1 | 1 | 1 |

In the second example, $q_1$ is mapped onto $z_1$, $q_2$ is mapped onto $z_2$, $q_4$ is mapped onto $z_4$, $q_5$ is mapped onto $z_5$, and $q_6$ is mapped onto $z_6$. The bits $z_1$, $z_2$, $z_4$, $z_5$, and $z_6$ form the first set. It is readily verified that the modification in Table 4 provides that $\sigma_1 = z_1 W_1 + z_2w_2 + z_4 W_4 + z_5 W_5 + z_6 W_6$ is on average above zero. Furthermore, in the second example, $q_3$ is mapped onto $z_3$ and $q_7$ is mapped onto $z_7$. The bits $z_3$ and $z_7$ form the second set. It is readily verified that the modification in Table 4 provides that $Q_2 = z_3 W_3 + z_7 w_7$ is on average below zero. In the second example, the third set is empty. Furthermore, $\sigma_1 + \sigma_2 = (q_1w_i + q_4w_4 + q_5w_5) + (q_2w_2 + q_6w_6) + (q_3w_3 + q_7w_7)$, which was observed above to be zero on average.

If the detected DC level at the output 140 is above zero, then the analog weights can be adjusted by either increasing the analog weights $a_3$ and $a_7$, or by decreasing the analog weights $a_1$, $a_2$, $a_4$, $a_5$, and $a_6$. Conversely, if the detected DC level at the output 140 is below zero, then the analog weights can be adjusted by either decreasing the analog weights $a_3$ and $a_7$, or by increasing the analog weights $a_1$, $a_2$, $a_4$, $a_5$, and $a_6$. This procedure can be iterated until the analog weights $a_3$ and $a_7$ have been matched with the analog weights $a_i$, $a_2$, $a_4$, $a_5$, and $a_6$ to within tolerable tolerances for a given specification.

The modifications of Table 2 shown in Table 3 and Table 4 are merely examples. There are other modifications that can be used. For example, the modifications for negative decimal values in Table 3 and Table 4 can be made in a corresponding way for positive decimal values instead. Combinations of modifications for both positive and negative decimal values are also possible.

As described above, the digital control circuit 110 may be configured to operate in one or more weight-calibration modes. According to some embodiments, each of the first set and the second set may consist of a single bit in at least one of the weight-calibration modes. This facilitates pairwise calibration of analog weights with the same nominal weight.

According to some embodiments, the first set and the second set may consist of different numbers of bits in at least one of the weight-calibration modes. The first and second examples of the calibration of analog weights with different nominal weights illustrate such embodiments.

According to some embodiments, each of the first set and the second set may consist of multiple bits in at least one of the weight-calibration modes. Again, the first and second examples of the calibration of analog weights with different nominal weights illustrate such embodiments.

Figure 4:
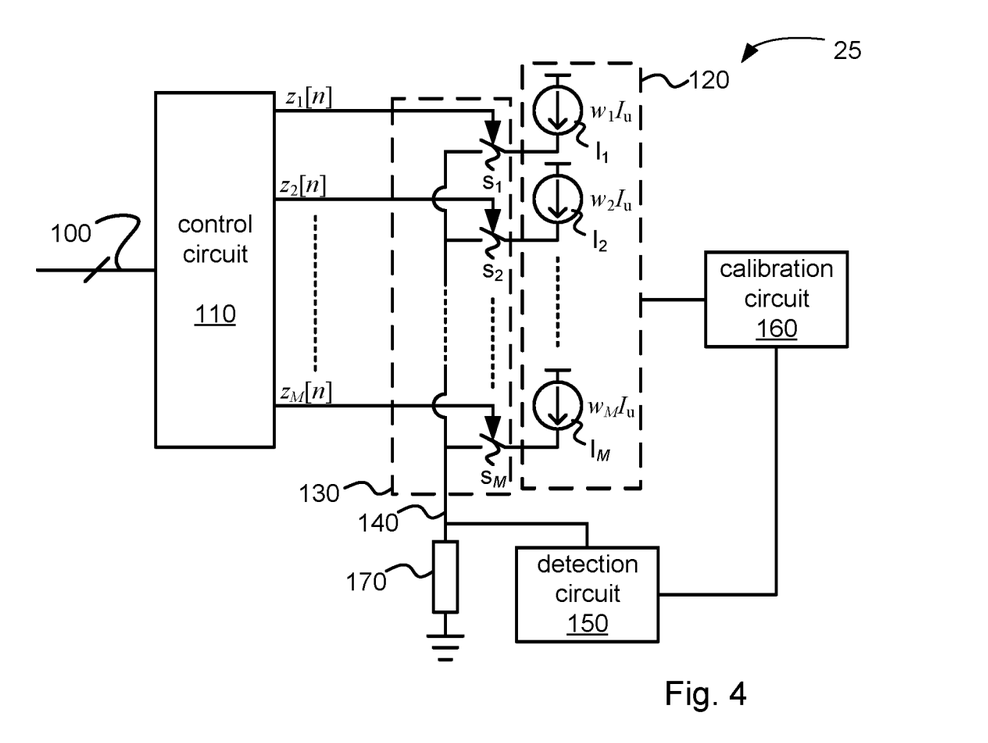
FIG. 4 is a diagram of a DAC according to some embodiments.

FIG. 4 illustrates a current-switching implementation of the DAC 25 according to an embodiment. In this embodiment, the analog weights are implemented as weighted current sources. The analog weight $a_i$ is implemented with a current source $I_i$ nominally generating the current $w_iI_u$, where $I_u$ is a unit current. The summation circuitry 130 is implemented with a number of switches $s_i$ configured to selectively connect the current sources $I_i$ to the output 140 under control of the bits $z_i[n]$ of the control word z[n]. When the bit $z_i[n] = +1$, then the switch $s_i$ is closed, and when the bit $z_i[n] = -1$, the switch $s_i$ is closed. FIG. 4 shows a resistive load 170 connected between the output 140 and ground. The load 170 may be comprised in the DAC 25, or may be external to the DAC 25. Current-switching DACs are, per se, well known in the art of DAC design. The embodiment in FIG. 4 is merely an example of a current-switching implementation. Numerous different variations are conceivable, which may e.g. be differential or single-ended, implemented with current sinks or current sources, or both, etc., as would be well understood by a person skilled in the art of DAC design.

Figure 5:
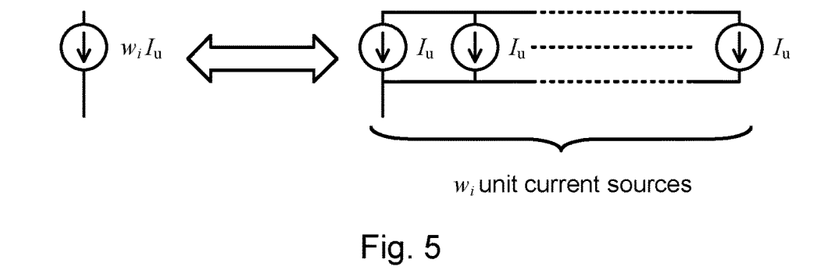
FIG. 5 illustrates an implementation of a weighted current source.

FIG. 5 illustrates how a current source with nominal current $w_i I_u$ can be implemented by connecting $w_i$ unit current sources (i.e. current sources nominally generating the current $I_u$) in parallel.

Figure 6:
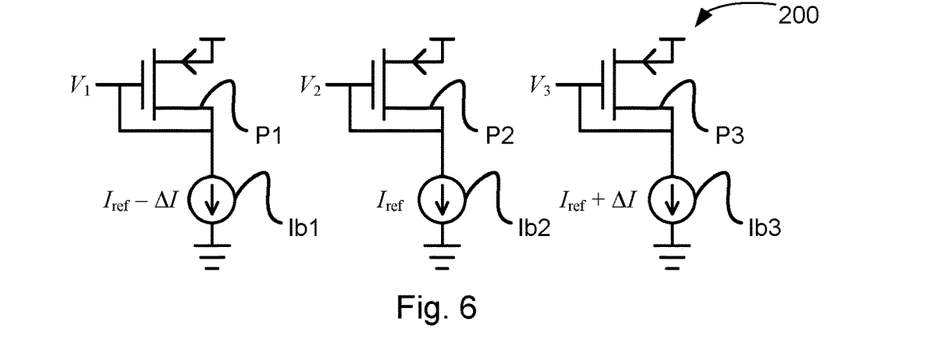
FIG. 6 is a circuit diagram of a bias circuit configured to generate multiple bias voltages.

FIG. 6 illustrates an embodiment of a bias circuit 200 that is configured to generate multiple bias voltages $V_1$-$V_3$. The bias circuit may be comprised in the calibration circuit 160. In the embodiment illustrated in FIG. 6, the bias circuit 200 comprises a first subcircuit configured to generate a first bias voltage $V_1$, a second subcircuit configured to generate a second bias voltage $V_2$, and a third subcircuit configured to generate a third bias voltage $V_3$.

The first subcircuit comprises a PMOS transistor P1 having its gate terminal connected to its drain terminal. A MOS (Metal-Oxide-Semiconductor) transistor connected this way is sometimes referred to as a diode-connected MOS transistor. Furthermore, the PMOS transistor P1 has its source terminal connected to a supply voltage node. Moreover, the first subcircuit comprises a current source Ib1 connected to the drain terminal of the PMOS transistor P1. The current source Ib1 is configured to generate a current $I_{ref}-\Delta I$, where $I_{ref}$ is a reference current and $\Delta I$ is a deviation from the reference current. The first subcircuit is configured to generate the bias voltage $V_1$ on the gate terminal of the PMOS transistor P1.

The second and third subcircuits are configured in a similar way as the first subcircuit. The second subcircuit comprises a diode-connected PMOS transistor P2 having its source terminal connected to the supply voltage node. Moreover, the second subcircuit comprises a current source Ib2 connected to the drain terminal of the PMOS transistor P2. The current source Ib2 is configured to generate the current $I_{ref}$. The second subcircuit is configured to generate the bias voltage $V_2$ on the gate terminal of the PMOS transistor P2. The third subcircuit comprises a diode-connected PMOS transistor P3 having its source terminal connected to the supply voltage node. Moreover, the third subcircuit comprises a current source Ib3 connected to the drain terminal of the PMOS transistor P3. The current source Ib3 is configured to generate the current $I_{ref}+\Delta I$. The third subcircuit is configured to generate the bias voltage $V_3$ on the gate terminal of the PMOS transistor P3. The PMOS transistors P1, P2, and P3 in FIG. 6 may be designed with the same size.

The bias circuit shown in FIG. 6 is configured to generate three different bias voltages. This can be extended in a straightforward manner by adding further subcircuits configured to generate further bias voltages.

Figure 7:
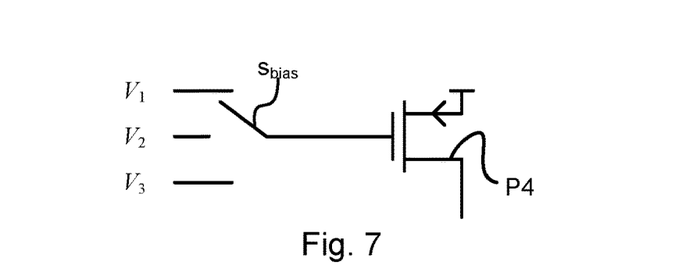
FIG. 7 is a circuit diagram of a current source with controllable bias voltage.

FIG. 7 illustrates how the bias circuit 200 in FIG. 6 can be used to adjust the current of an adjustable current source. The adjustable current source may be used to implement current sources, such as unit current sources, in a current-switching implementation of the DAC 25. In FIG. 7, the adjustable current source is implemented with a PMOS transistor P4 having its source terminal connected to the supply voltage node. Furthermore, FIG. 7 shows a switch $s_{bias}$ connected to the gate terminal of the PMOS transistor P4. The switch $s_{bias}$ may be comprised in the calibration circuit 160. The switch $s_{bias}$ is configurable to connect the gate terminal of the PMOS transistor to either one of the bias voltages $V_1$-$V_3$. The drain current generated by the PMOS transistor P4 can be adjusted by changing which one of the bias voltages $V_1$-$V_3$ the gate terminal of P4 is connected to.

An adjustable current source can also be implemented with a fixed current source in parallel with a current-switched DAC according to some embodiments.

The DC-detection circuit 150 may be zeroed, or reset, before the weight calibration is performed. For instance, by generating the control word z[n] such that each of the bits $z_i[n]$ are, on average, zero, each of the bits $z_i[n]$ provides a zero contribution to the DC level at the output 140. This can e.g. be accomplished by using DEM, such as pairwise swapping. The DC-detection circuit 150 can measure the DC level thus obtained for the physical quantity representing the output Y(t) and use this as the zero level during the weight calibration. This eliminates, or at least suppresses, any DC offsets not caused by mismatch in the analog weights, such as any DC offset within the DC-detection circuit 150 itself. Such DC offsets not caused by mismatch in the analog weights and be compensated for either at the input of the DC-detection circuit 150 or at the output if the DC detection circuit. The DC detection circuit 150 may e.g. be implemented with a relatively slow but accurate ADC. In that case, said compensation of DC offsets not caused by mismatch in the analog weights can be performed by a constant level shift in the analog domain at the input of sad ADC, or by subtraction of a corresponding constant value in the digital domain at the output of sad ADC.

It should also be noted that, in some embodiments, once the calibration has been done, the DAC 25 can be operated in a regular manner, e.g. as a regular thermometer-coded, segmented, or decomposed DAC, or whatever DAC architecture is used. In other embodiments, the calibration may be performed continuously to track time variations of analog weights, e.g. due to temperature variations etc.

Figure 8:
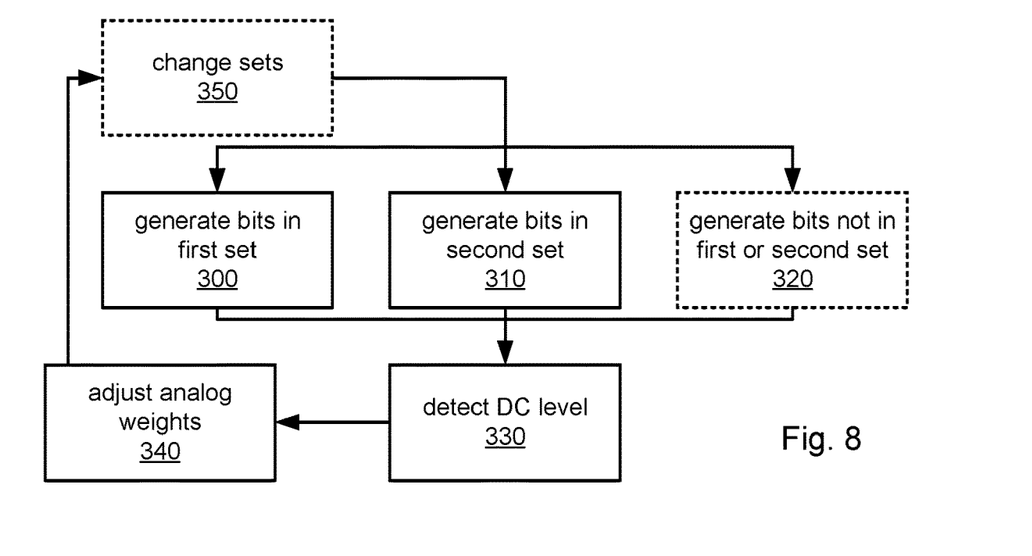
FIGS. 8-9 show flowcharts of embodiments of a method.

According to some embodiments, there is provided a method of weight calibration in the DAC 25. A flowchart of the method according to some embodiments is shown in FIG. 8. The method comprises, during a measurement procedure, generating 300 the bits of the first set as described above, and generating 310 the bits of the second set as described above. The method may further comprise generating 320 the bits in the third set (i.e. the bits not in the first set or the second set, if any), for instance such that each of the bits in the third set is, on average, zero. The steps 300, 310, and 320 in FIG. 8 may, for instance, be carried out by the digital control circuit 110. The method further comprises detecting 330 the DC level at the output 140 of the DAC 25 during the measurement procedure. Step 330 may, for instance, be carried out by the detection circuit 150. Furthermore, the method comprises adjusting 340 the analog weights associated with the bits in the first set or the second set in response to the detected DC level. Step 340 may, for instance, be carried out by the calibration circuit 160. After step 340, the measurement procedure may be iterated again, possibly after changing the constitution of the first set and/or the second set in step 350. Hence, in some embodiments, the measurement procedure is iterated with different bits in the first or second sets in different iterations, thereby resulting in a plurality of detected DC levels by the DC-detection circuit 150. Again, the word "or" in the preceding sentence should be interpreted as a normal logical "or" (i.e. "and/or", not as an "exclusive or"). The iteration of the measurement procedure may e.g. be controlled by the control circuit 110. Different weight-calibration modes may be used in different iterations of the measurement procedure.

In view of the above, said measurement procedure may comprise steps 300, 310 and 330, and possibly step 320 if used. Furthermore, said measurement procedure may include step 340, i.e. said measurement procedure may be a measurement-and-adjustment procedure.

Figure 9:
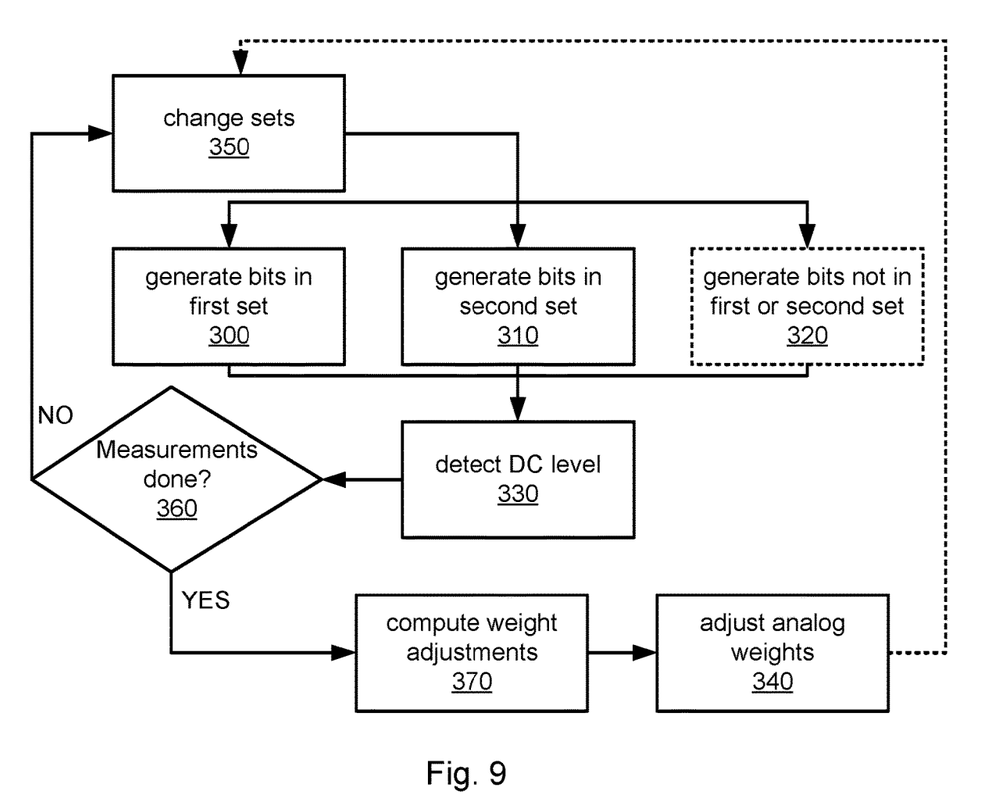

The embodiments illustrated with the flowchart in FIG. 8 uses iterative pairwise adjustments of sets of analog weights to gradually obtain calibrated analog weights. In alternative embodiments, pairwise measurements (without weight adjustments during the iterations of the measurement procedure) of weight mismatches between sets of analog weights can be made instead, whereby the required adjustments of analog weights can be computed (for all analog weights in one go) by solving a set of linear equations and applying suitable boundary conditions (e.g. fixing a certain analog weight or the sum of the analog weights, or some other boundary condition that would result in a set of linear equations with full rank). A flowchart illustrating such an alternative embodiment of said method is illustrated with a flowchart in FIG. 9. Compared with the flowchart in FIG. 8, the step 340 of adjusting the analog weights in response to the detected DC level has been move outside the measurement loop, i.e. outside the iterations of the measurement procedure. After step 330, instead of adjusting the analog weights of the sets that have just been subject to comparison, it is checked in step 360 whether all pairwise measurements of weight mismatches between groups of analog weights have been done. If the answer is NO, the constitution of the first set and/or the second set are changed in step 350, and a measurement of the weight mismatches of the corresponding sets of analog weights is performed by detecting the DC level in step 330. If the answer (in step 360) is YES, then the required weight adjustments are computed in step 370 in response to the plurality of detected DC levels from the iterations of step 330. These adjustments are then performed in step 340. As indicated with the dashed arrow in FIG. 9, the whole procedure may then start over again, e.g. to account for drift over time of the weight mismatches.

Figure 10:
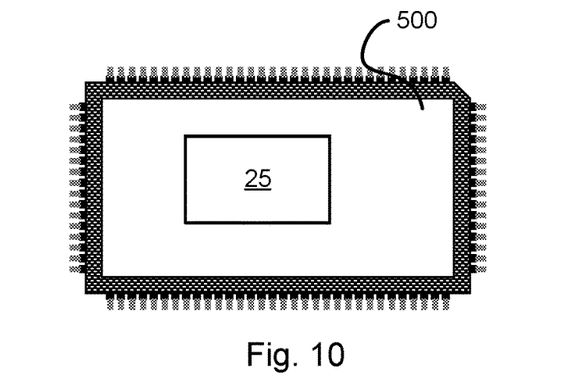
FIG. 10 illustrates an integrated circuit comprising a DAC.

Embodiments of the DAC 25 are suitable for integration on an integrated circuit. This is illustrated in FIG. 10, schematically showing an integrated circuit 500 comprising the DAC 25.

The disclosure above refers to specific embodiments. However, other embodiments than the above described are possible within the scope of the invention. For example, embodiments of the DAC 25 may be used in other types of electronic apparatuses than communication apparatuses. For instance, embodiments of the DAC 25 may be used in audio applications. As another example, embodiments of the DAC 25 may be used as a feedback DAC in an ADC, such as a delta-sigma ADC. Furthermore, the thermometer-coded, segmented, and decomposed architectures are merely examples of DAC architectures that can be weight-calibrated using the weight-calibration procedures described herein. Other architectures include, but are not limited to, multi-layer decomposed DACs (see e.g. [Andersson, 2005]), partially decomposed DACs (see e.g. [Andersson, 2005]), and multi-segmented DACs (where different segments of bits in the input word x are encoded into thermometer codes with different bit weights). Alternatively, a hybrid between the decomposed DAC and the segmented DAC may be used. Consider, for instance, the (1-layer) decomposed architecture illustrated with Table 2 above. It has two binary-weighted parts represented with the words $[q_3\ q_2\ q_1]$ and $[q_7\ q_6\ q_5]$. Each of these binary-weighted parts can be transformed into segmented parts by encoding the MSBs $[q_3\ q_2]$ and $[q_7\ q_6]$ into corresponding thermometer codes, whereby such a hybrid between the decomposed DAC and the segmented DAC is obtained. Furthermore, a current-switching implementation was shown as a mere example, but the weight-calibration procedures disclosed herein may equally well be applied to other types of DACs, such as but not limited to charge-redistribution DACs, resistive ladder DACs, and capacitive ladder DACs. Moreover, FIG. 3 illustrates the summation circuitry 130 and the set 120 of analog weights as separate blocks. In some embodiments, the summation circuitry 130 and the set 120 of analog weights may be implemented with common circuitry. For instance, in ladder DACs (such as resistive ladder DACs and capacitive ladder DAC), a ladder circuit (such as a resistor ladder or capacitor ladder) is involved both in the realization of the analog weights as well as in the weighted summation of the bits in the control word. The set 120 of analog weights may in such embodiments be seen as being comprised in the summation circuit 130. The different features and steps of the embodiments may be combined in other combinations than those described.

The invention claimed is:

1. A method of weight calibration in a digital-to-analog converter (DAC) that produces an analog sample corresponding to a digital sample represented by a digital input word (x[n]) input to the DAC, based on the DAC encoding the digital input word (x[n]) into a control word (z[n]), with each bit ($z_i$) in the control word (z[n]) having a corresponding bit weight ($w_i$) and in the following considered to adopt values in $\{-1, 1\}$, and with the analog sample produced by the DAC summing the bits in the control world weighted by respective analog weights in a set of analog weights, and wherein the method comprises, during a measurement procedure:

for a first set of at least one bit of the control word (z[n]), generating the bits of the first set, such that a first sum of the bits in the first set weighted by their respective bit weights is, on average, above zero;

for a second set of at least one bit of the control word (z[n]), generating the bits of the second set, such that a second sum of the bits in the second set weighted by their respective bit weights is, on average, below zero and such that the sum of the first sum and the second sum is, on average, equal to zero; and detecting a DC level of the analog sample; and adjusting at least one analog weight in the set of analog weights in response to the detected DC level.

2. The method according to claim 1, comprising, for each of the bits of the control word (z[n]) not in the first set or the second set, generating the bit such that the bit is, on average, zero.

3. The method according to claim 1, wherein each of the first set and the second set consists of a single bit.

4. The method according to claim 1, wherein the first set and the second set consist of different numbers of bits.

5. The method according to claim 1, wherein each of the first set and the second set consists of multiple bits.

6. The method according to claim 1, wherein said measurement procedure is iterated with different bits in the first or second set, thereby resulting in a plurality of detected DC levels.

7. The method according to claim 6, wherein the step of adjusting the at least one analog weight in the set of analog weights comprises adjusting, in each iteration of the measurement procedure, at least one analog weight associated with bits in the first set or the second set in that iteration of the measurement procedure in response to the detected DC level in that iteration of the measurement procedure.

8. The method according to claim 6, wherein the method comprises computing weight adjustments in response to the plurality of detected DC levels after the iterations of the measurement procedure, and wherein the step of adjusting at the least one analog weight comprises performing the computed adjustments.

9. A digital-to-analog converter (DAC) comprising:

an input port for receiving a sequence of digital input words (x[n]), each representing a digital input sample;

a digital control circuit configured to encode each digital input word ($x[n]$) into a control word ($z[n]$) representing the same digital input sample, each bit ($z_i$) in the control word ($z[n]$) having a corresponding bit weight ($w_i$) and in the following considered to adopt values in $\{-1, 1\}$;

a set of analog weights, each associated with a unique one of the bits ($z_i$) in the control word ($z[n]$);

summation circuitry configured to generate an analog sample corresponding to the digital input sample by summing the bits in the control word ($z_i$) weighted by the respective associated analog weights; and an output for outputting the analog sample;

wherein the digital control circuit, in at least one weight-calibration mode, is configured to, during a measurement procedure:

for a first set of at least one bit of the control word ($z[n]$), generate the bits of the first set such that a first sum of the bits in the first set weighted by their respective bit weights is, on average, above zero; and for a second set of at least one bit of the control word ($z[n]$), generate the bits of the second set such that a second sum of the bits in the second set weighted by their respective bit weights is, on average, below zero and such that the sum of the first sum and the second sum is, on average, equal to zero; and wherein the DAC further comprises:

a DC-detection circuit configured to detect a DC level at the output of the DAC during the measurement procedure; and a calibration circuit configured to adjust at least one analog weight in the set of analog weights, in response to the detected DC level.

10. The DAC according to claim 9, wherein the digital control circuit is configured to, in the at least one of the weight calibration modes, for each of the bits of the control word ($z[n]$) not in the first set or the second set, generate the bit such that the bit is, on average, zero.

11. The DAC according to claim 9, wherein, in at least one of the weight-calibration modes, each of the first set and the second set consists of a single bit.

12. The DAC according to claim 9, wherein, in at least one of the weight-calibration modes, the first set and the second set consist of different numbers of bits.

13. The DAC according to claim 9, wherein, in at least one of the weight-calibration modes, each of the first set and the second set consists of multiple bits.

14. The DAC according to claim 9, wherein the control circuit is configured to iterate said measurement procedure with different bits in the first or second set, thereby resulting in a plurality of detected DC levels by the DC-detection circuit.

15. The DAC according to claim 14, wherein the calibration circuit is configured to, in each iteration of the measurement procedure, adjust at least one analog weight associated with bits in the first set or the second set in that iteration of the calibration procedure in response to the detected DC level in that iteration of the calibration procedure.

16. The DAC according to claim 14, wherein the control circuit is configured to compute weight adjustments in response to the plurality of detected DC levels after the iterations of the measurement procedure, and the calibration circuit is configured to perform the computed adjustments.

17. An electronic apparatus comprising the DAC according to claim 9.

18. The electronic apparatus of claim 17, wherein the electronic apparatus is a communication apparatus.

19. The electronic apparatus of claim 18, wherein the communication apparatus is a wireless communication device for a cellular communications system.

20. The electronic apparatus of claim 18, wherein the communication apparatus is a base station for a cellular communications system.

21. An integrated circuit comprising the DAC according to claim 9.

* * * * *